(12) United States Patent
Laurent et al.

(10) Patent No.: US 7,173,824 B2
(45) Date of Patent: Feb. 6, 2007

(54) COOLED POWER SWITCHING DEVICE

(75) Inventors: Patrice Laurent, Viuz en Sallaz (FR);
Marc Meynet, Reignier (FR); Cécile Deviller, La Roche sur Foron (FR);
Marc Hervieu, Gaillard (FR)

(73) Assignee: DAV (FR)

( * ) Notice: Subject to any disclaimer, the term of this patent is extended or adjusted under 35 U.S.C. 154(b) by 243 days.

(21) Appl. No.: 10/513,377

(22) PCT Filed: Apr. 23, 2003

(86) PCT No.: PCT/FR03/01289

§ 371 (c)(1),
(2), (4) Date: Dec. 9, 2004

(87) PCT Pub. No.: WO03/094585

PCT Pub. Date: Nov. 13, 2003

(65) Prior Publication Data

US 2005/0206357 A1    Sep. 22, 2005

(30) Foreign Application Priority Data

May 3, 2002    (FR) .................... 02 05555

(51) Int. Cl.
H05K 7/20    (2006.01)
(52) U.S. Cl. .................. 361/707; 361/719; 439/949
(58) Field of Classification Search ................ 361/690,
361/702, 704, 707, 711, 712, 719, 720; 174/16.2,
174/520; 257/691, 711; 439/76.2, 949
See application file for complete search history.

(56) References Cited

U.S. PATENT DOCUMENTS 3,153,750 A * 10/1964 Ackerman .................. 257/670
3,982,271 A *  9/1976 Olivieri et al. ............. 257/664
4,030,001 A *  6/1977 Medley et al. .............. 361/761
6,466,451 B2* 10/2002 Mizuno et al. .............. 361/796
6,696,643 B2*  2/2004 Takano ....................... 174/520
6,700,194 B2*  3/2004 Nakajima et al. ........... 257/707

FOREIGN PATENT DOCUMENTS

| DE | 195 18 522 | 11/1996 |
| EP | 1 178 594  | 2/2002  |
| FR | 2 800 567  | 5/2001  |

* cited by examiner

Primary Examiner—Michael Datskovsky
Assistant Examiner—Robert J. Hoffberg
(74) Attorney, Agent, or Firm—Ostrolenk, Faber, Gerb & Soffen, LLP

(57) ABSTRACT

This power switching device comprises semiconductor members (60) having drain, gate and source connections. Said members (60) are soldered by their drain soles to protuberances of an electrically conductive cooling plate (20), while the gates and the sources (62, 63) of the semiconductor members (60) are connected to a control circuit and to power connectors via a routing circuit (40) placed generally parallel to and in the vicinity of said plate (20) but separated therefrom by a spacer (30) and having openings (42) corresponding to the flat protuberances of the subjacent plate (20), which protuberances lie in a plane close to the routing circuit (40), by means of which the semiconductor devices (60) may be connected to the plate (20) and to the routing circuit (40) substantially in the same plane.

11 Claims, 5 Drawing Sheets

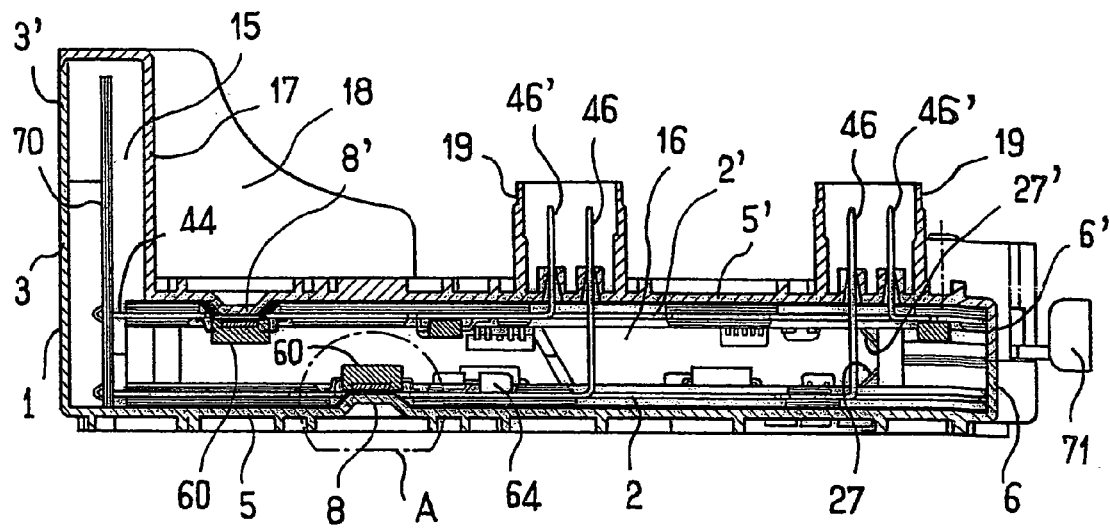
FIG_1
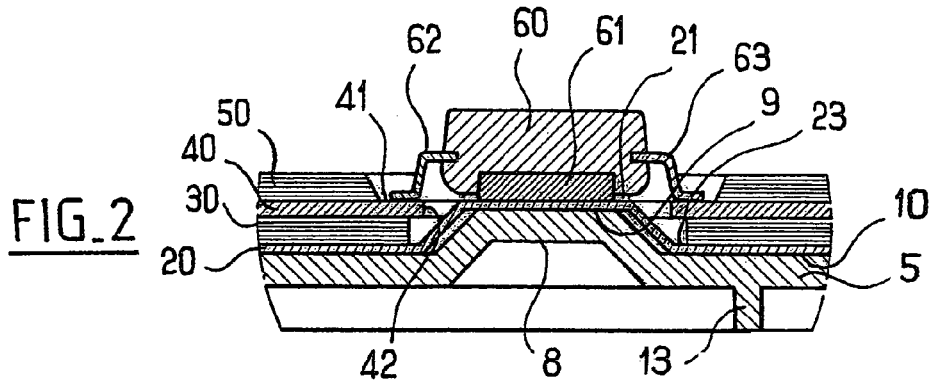
FIG_2
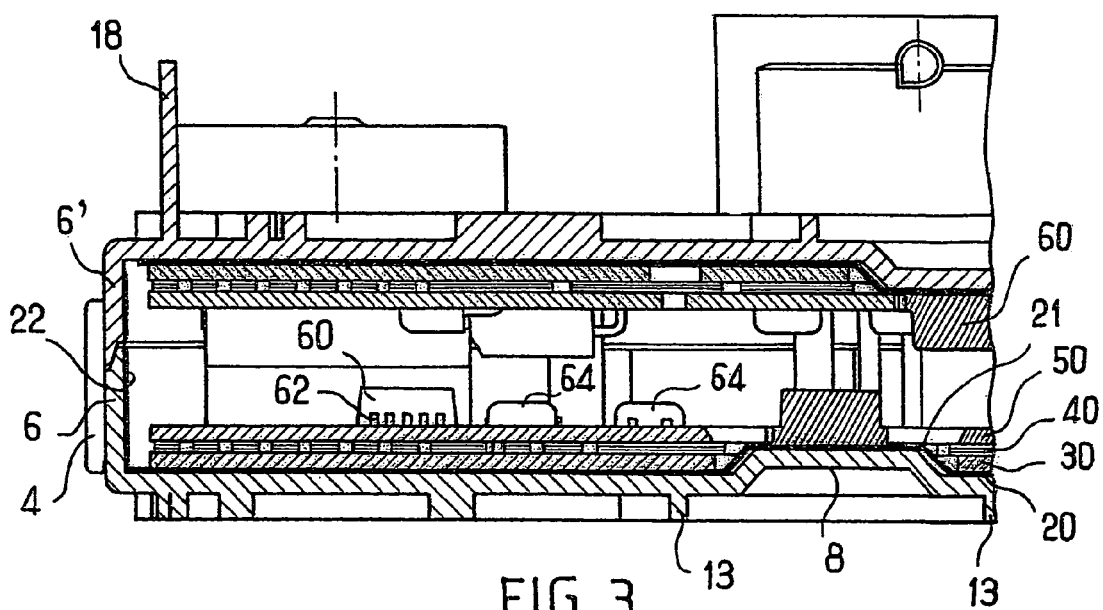
FIG_3

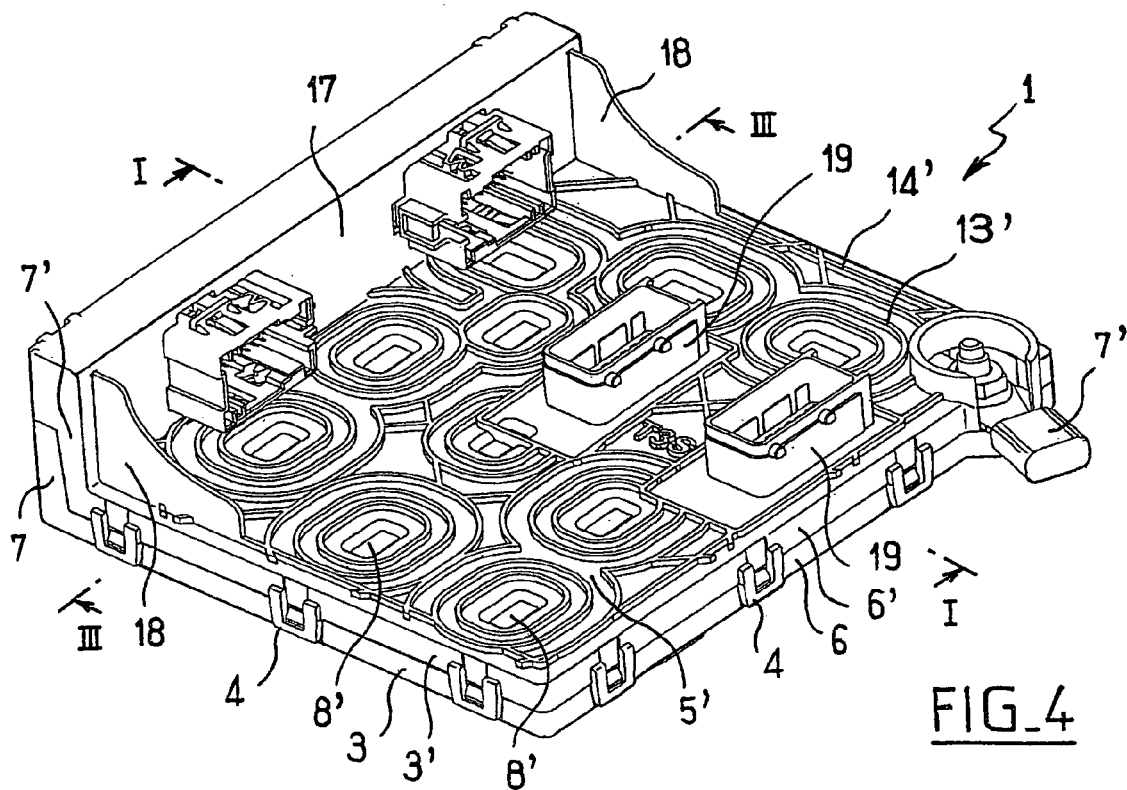
FIG_4
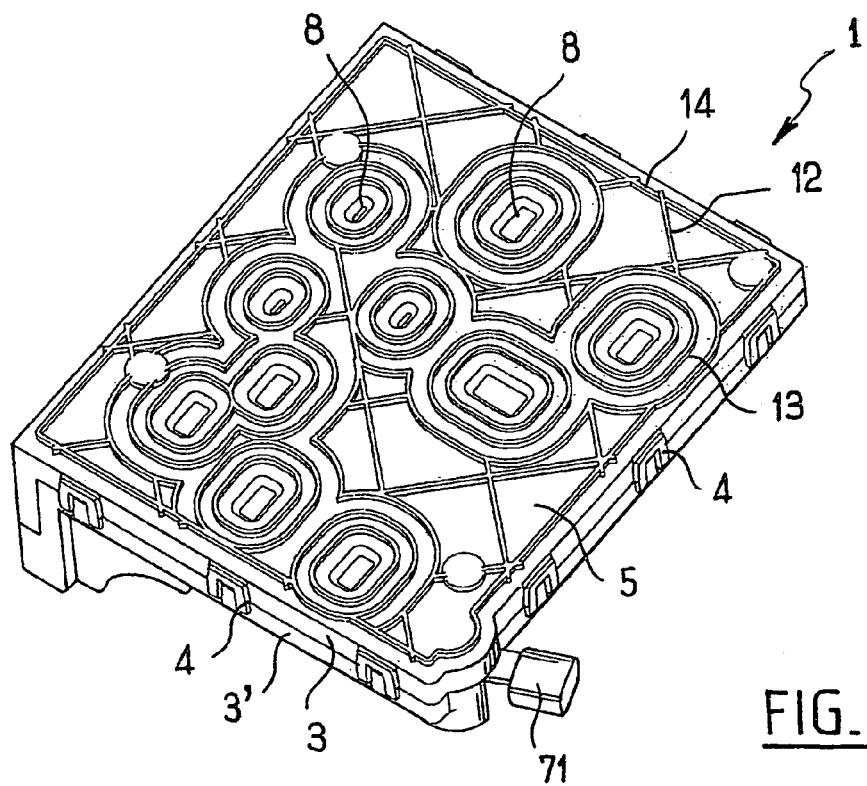
FIG_5

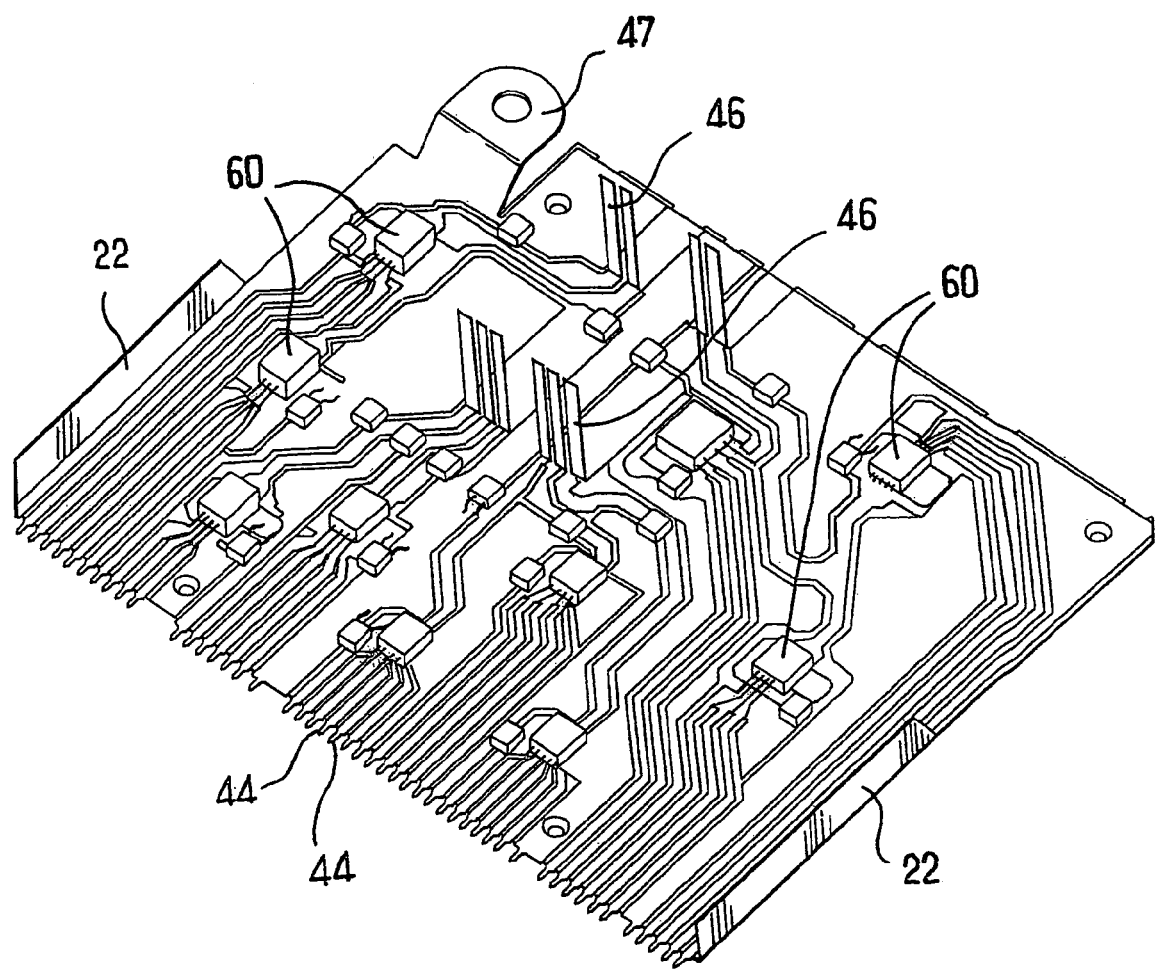
FIG_7

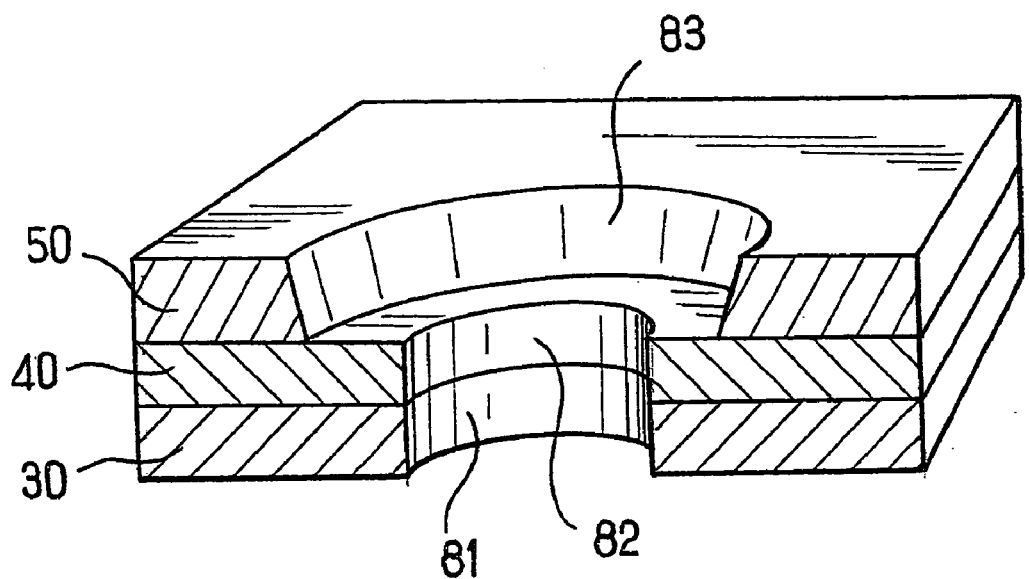
FIG_8
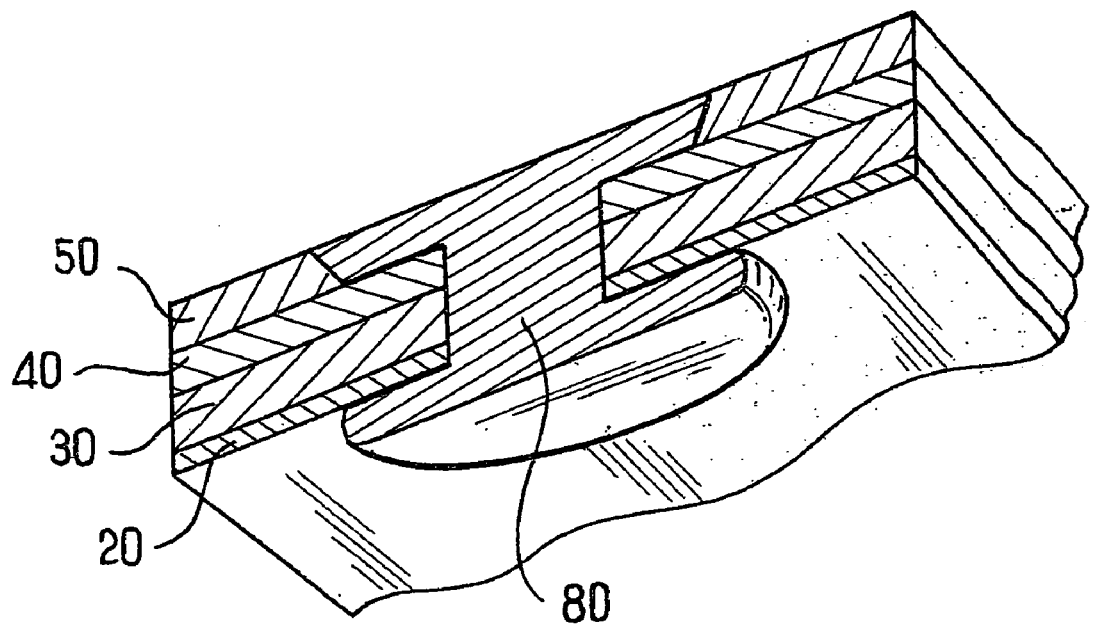
FIG_9

US 7,173,824 B2

COOLED POWER SWITCHING DEVICE

BACKGROUND OF THE INVENTION

The present invention relates to a power switching device, especially one intended for interconnection modules for internal combustion engine vehicles or electric vehicles, using semiconductor switching members whose dissipated thermal power has to be optimally extracted.

Document FR 2 800 567 discloses a power switching device comprising semiconductor switching members having two sets of connections, said semiconductor devices being fixed by their base to a cooling plate made of copper or other conductor metal to which the first set of connections is connected, while the second set of connections of the semiconductor devices is connected to a control circuit and to power connectors. The switching members are, for example, of the MOSFET or Smart Power type; in the case of a MOSFET member, the first set of connections includes the drain and the second set of connections includes the gate and the source; in the case of a Smart Power member, the first set of connections includes the supply and the second set of connections includes the 1 to n inputs, the 1 to n outputs, the current sensor and ground. The switching members advantageously include a sole (the drain in the case of a MOSFET) that is directly affixed to the cooling plate by soldering or pressing. The cooling plate itself is affixed to a plastic support plate constituting part of a package and contributing to dissipating heat to the outside by radiation. The connections of the second set of connections of the switching members are connected by transverse pins to a routing circuit placed parallel to the cooling plate. These pins are formed by leads cut and folded from the copper plate serving for cooling and for equipotentialization of the first connections. The fact that the electrical distribution and the thermal cooling are carried out by one and the same copper plate imposes limitations on the possible ways of organizing the circuits and of making them compact.

SUMMARY OF THE INVENTION

The object of the invention is to further improve the organization and compactness of such a cooled power switching device.

The object of the invention is achieved by means of a power switching device comprising semiconductor switching members having two sets of connections, said semiconductor members being affixed by their base to an electrically conductive cooling plate to which a first set of connections is connected, while the second set of connections of the semiconductor members is connected to a control circuit and to power connectors, wherein said plate includes protuberances onto which the semiconductor members are fixed or pressed by their base and wherein the second set of connections is connected to the control circuit through a routing circuit that is placed generally parallel to and in the vicinity of said plate but isolated therefrom and having openings corresponding to the flat protuberances of the subjacent plate, which protuberances lie in a plane close to the routing circuit, by means of which the semiconductor members may be fixed to the plate and to the routing circuit substantially in the same plane. Thus, according to the invention the electrical distribution function is split into two parallel circuits, namely the supply or drain circuit, advantageously produced in the stamped metal cooling plate, which distributes the positive or negative voltage of the battery to the first set of connections (drain, sole, pin) of the switching members, and the routing circuit, advantageously made in a cut metal plate, which distributes the power outputs and the connections to the control circuit. The plate for the drain circuit continues to provide electrical cooling and this heat dissipation may take place in an optimized manner since the plate is reserved for the implantation of the dissipating portion of the components. This plate may especially be brought into almost complete contact, and especially at the location of the protuberances, with a plastic wall of the package, thus favoring heat exchange. The routing function, that is to say the routing of the tracks of the component to the outside or to the control circuit, is provided in another stage, further away from the plastic wall. The cut plate forming the routing circuit also makes it possible to advantageously include the development of the connector blades.

Document DE 195 18 522 discloses a control device for automobiles, in which the power components placed on a printed-circuit board are cooled by a cooling plate parallel to the board and including protuberances in the immediate vicinity of said components. This cooling plate is used as a current rail for supplying the separate electrical components, such as coils. The cooling plate is not used for supplying the power components, from which it is, on the contrary, electrically isolated.

Advantageously, according to the invention, the semiconductor members have, at their base, a sole (for example a drain sole) directly soldered or pressed onto the protuberances of the cooling plate. However, other ways of connecting the base of the members to the protuberances are possible, such as adhesive bonding of the sole and electrical connection produced by a pin. It is also possible to envision localized laser soldering of the sole, which solves the problem associated with a lack of planarity. It is also possible for the MOS or Smart Power devices to be delivered as bare chips: instead of soldering the drain, the chip is soldered directly to the drain circuit, and instead of soldering the pins of the components, a bonding connection is made between the chip and the routing circuit. In other words, in this embodiment, the first set of connections is reduced to direct soldering and the second set of connections is established during the operation of mounting the circuit.

Advantageously, said switching device constitutes a module contained in a plastic package that includes raised elements corresponding to the protuberances of the cooling plate. This is because, owing to the fact that the cooling plate is used only for the implantation of the switching members, which is accomplished on the aforementioned protuberances, it is possible and advantageous to give the bottom of the package to which the cooling plate is affixed an almost identical three-dimensional adjacent shape so as to favor heat exchange, since the radiating power of the plastic is greater than that of bare copper.

For the same purpose, the bottom of the package, or the package itself, may include ribs around the outside, which serve to increase the rate of heat exchange and also to stiffen the bottom of the package.

Advantageously, the routing circuit and the cooling plate are spaced apart and joined together by a spacer layer made of nonconductive material, such as a plastic, intended to ensure precise relative positioning of the two circuits, the assembly forming a two-sided circuit. This spacer layer may be combined with the two circuits by adhesive bonding (with a resin or other material) or by hot or ultrasonic crimping by means of deformed studs providing the mechanical link. However, it is advantageous for the spacer layer to be overmolded onto the routing circuit, thereby making it possible to ensure mechanical retention of the cut tracks on the circuit for example.

Preferably, a covering layer is also provided on the other side of the routing circuit, thereby making it possible to protect and seal the circuit and also to profit from the infrared radiative power of the covering layer in order to extract heat to the outside of the module. This covering layer may be formed by a simple lacquer or an encapsulation resin. However, it is advantageous to provide it in the form of a layer of plastic overmolded onto the routing circuit, thereby making it possible to even out any tendency to bending of the routing circuit during one-sided overmolding.

The overmolded-sandwich cooling plate, formed from the spacer, the routing circuit and the covering layer, may be fixed by rivets obtained by overmolding in mold cavities provided in the aforementioned sandwich.

Advantageously, the cooling plate includes lateral fins, for example placed against the sides of the package and further increasing heat dissipation. These fins may be made by bending at the same time as the stamping operation for forming the protuberances.

The control circuit board may be placed perpendicular or parallel to the cooling plate and to the routing circuit (as in the aforementioned document FR 2 800 567) by means of transverse tabs. However, more advantageously, the circuit includes a lateral control plate, on one side of the routing circuit. It is then easy to provide connection pins placed on the side of the routing circuit and intended to plug into the board of the control circuit.

Advantageously, the package contains two superposed circuit modules, placed facing each other and connected to one and the same control circuit board.

Of course, apart from the semiconductor components mentioned, the circuit modules may include very diverse types of surface mounted components (SMCs), such as relays, capacitors, diodes and resistors, and especially through-type components that may be soldered by any means, such as selective wave, robot, laser or manual soldering.

Other advantages and features will become apparent on reading the description of the invention and from the appended drawings in which:

BRIEF DESCRIPTION OF THE DRAWINGS

FIG. 1 is a cross-sectional view, in the plane I—I of FIG. 4, of the device of the invention;

FIG. 2 is a view of detail A of the device of FIG. 1;

FIG. 3 is a sectional view perpendicular to that of FIG. 1, in the plane III—III of FIG. 4, of the device of the invention;

FIG. 4 is a perspective top view of the device of the invention in its package;

FIG. 5 is a perspective bottom view of the same device;

FIG. 7 is a perspective view a module according to the invention;

FIG. 8 is a schematic perspective view with a cut through an overmolded metal circuit having cutaways reserved for the overmolding of the crimping rivets; and FIG. 9 is a schematic view showing, at another angle, the assembly of FIG. 8 after the overmolding of the rivet.

DESCRIPTION OF A PREFERRED EMBODIMENT

Figure 6:
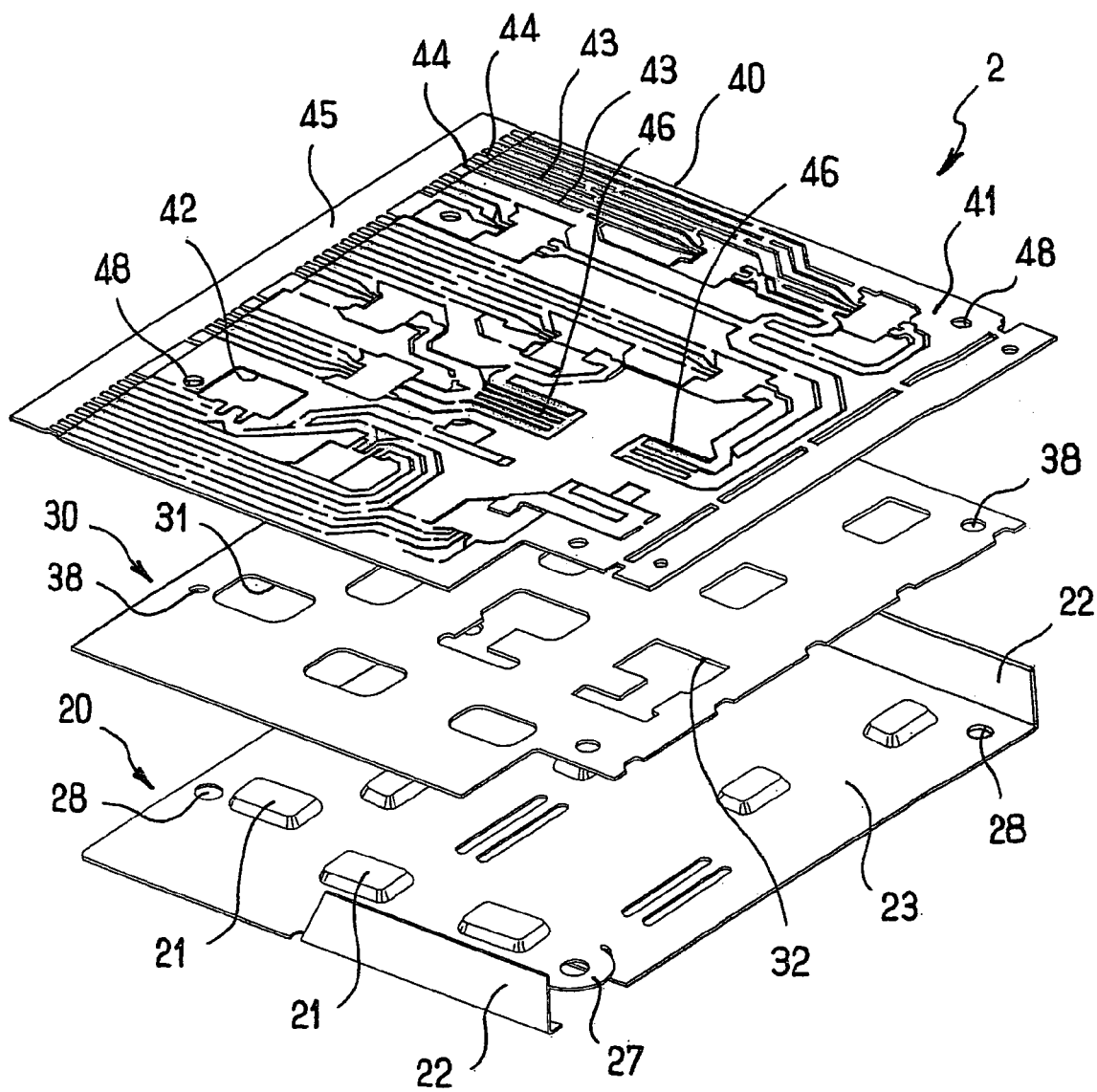
FIG. 6 is an exploded view showing the three layers intended to be stacked in order to form a module according to the invention.

The device of the invention as shown contains, in a flat package 1, two control modules, namely a lower module 2 and an upper module 2' respectively.

The package 1 consists of two flat half-packages, namely a lower half-package 3 and an upper half-package 3', which are formed from a substantially rectangular generally flat bottom 5, 5' surrounded by a lower raised edge 6, 6' on three sides and by an edge 7, 7' of different shape on the fourth side. The half-packages are joined together by fasteners 4 along the edges 6, 6' and possibly along the edge 7, 7'.

The bottoms 5, 5' include a number of protuberances 8, 8' of the same height, these being turned toward the inside of the package 1. These protuberances 8, 8' form a substantially rectangular plateau 9 raised above the mean plane 10 of the bottom 5, 5' and surrounded by a connection region sloping toward the plane 5, 5'. The bottom 5, 5' includes an array of ribs, 12, 13, 13', 14 that are placed diagonally (12) or else surrounding the protuberances (ribs, 13, 13') or else peripherally (ribs 14, 14'). These ribs contribute to stiffening the bottom but above all increase the area of heat exchange, especially around the protuberances.

The side 7, 7' of the half-packages 3, 3' is shaped so as to provide a secondary volume 15, generally orthogonal to the main volume 16 defined between the facing bottoms 5 and 5'. This secondary volume 15, adjacent to the main volume 16 along one side of the package 1, is partly bounded by a wall 17 perpendicular to the bottom 13' and reinforced by two brackets 18.

The two modules 2 and 2' are formed in the same manner and only the module 2 will be described in detail. It essentially comprises a two-sided circuit formed from a drain circuit 20, a spacer 30 and a routing circuit 40 and, where appropriate, a cover 50.

The drain circuit 20 is produced by a substantially rectangular electrically conductive plate made of metal, for example copper, which includes substantially rectangular protuberances 21 (or protuberances of other shape) that correspond to the protuberances 8 in the bottom 5 of the package. The plate 20 includes, on two sides, two raised lateral flanges 22, for example at right angles; each flange extends over a little less than one half of one side and its height is almost that of the volume 16 between the two opposed half-packages; this arrangement makes it possible to provide similar flanges on the equivalent plate of the upper module 2', It goes without saying that a different number of flanges, for example three flanges, could be provided.

The plateaus of the protuberances 21 define a plane that is parallel to and offset with respect to the plane of the bottom 23 of the plate 20.

Corresponding to this plane is the plane of the upper surface 41 of the routing circuit 40 formed by an electrically conductive plate made of metal, for example copper, cut so as to form, on the one hand, substantially rectangular recesses 42 corresponding to the protuberances 21 of the drain plate 20 and intended to leave these flush at the same level as the surface 41 and, on the other hand, conducting tracks 43 leading to pins 44 brought together along one side of the routing circuit plate. In FIG. 6, these pins are shown before the "deshunting" that will remove the retaining portion 45. The routing circuit 40 includes, in addition to the pins 44 already mentioned, other pins 46, 46' shown in FIG. 6 before being bent over and in FIG. 7 after they have been bent over, allowing them to leave the package perpendicular to the plane of the circuits, level with the two power connectors 19 located on the top of the package 1. The pins 44 themselves are plugged into an electronic control board 70 placed in the secondary volume 15.

The routing circuit 40 is kept parallel and at the correct distance from the drain circuit 20 thanks to a spacer 30 made of a nonconductive material. This spacer includes, on the one hand, recesses 31 corresponding to the protuberances 21 of the drain circuit and to the recesses 42 of the routing circuit and, on the other hand, other recesses 32 corresponding to passages for pins, such as pins 46, 46'.

Holes 28, 38, 48 in vertical correspondence in the three planes 20, 30, 40 allow relative positioning during the step of assembling the three planes and then the assembly into the package.

The control circuit includes semiconductor elements 60 comprising, in the case of MOSFETs for example, at their base, a drain sole 61 soldered to the plateau of a protuberance 21 of the drain plate 20. The element 60 also includes one or more gate pins 62 and one or more source pins 63, in the form of lateral tabs, which are soldered to a respective track 43 of the surface 41 of the routing circuit, at the edge of a recess 42.

A cover 50 of electrically nonconductive material is advantageously formed above the routing circuit, preferably by overmolding onto the routing plate, at the same time as the spacer 30 is formed, again by overmolding. This has two advantages: not only is the routing circuit protected on both sides but also the risk of it warping in the event of overmolding on only one side is avoided. The cover layer 50 may also be made in an encapsulation resin.

The control circuit also includes other circuit elements, such as elements 64, that do not require intense cooling and are placed directly on the routing circuit 40.

A supply terminal 71 that is intended to be connected to the battery is connected to a raised tab 27 formed in a corner of the drain plate 40 in such a way that the two tabs 27, 27' of the two plates of the facing modules can be connected to the same terminal 71.

The assembly of the various plates may be performed with or without crimping studs.

In the first method, the copper is cut to form the routing circuit 40, the drain circuit 20 is embossed and its lugs bent up, a spacer plate 30 is prepared and coated on both its sides with an adhesive, and the three plates are joined together. The adhesive is advantageously a resin, for example an epoxy type resin, deposited as a thin layer (typically with a thickness of about 200 μm, the spacer itself having, for example, a thickness of 1 mm). In this method, the spacer, together with the adhesive, ensures mechanical retention of the assembly.

In the second method, the spacer ensures this retention, in cooperation with the transverse assembly elements, of the stud or rivet type. The copper is cut to form the routing circuit 40, the routing circuit 40 is overmolded to form the two overmolding layers 30, 50 and then crimping studs are overmolded; the drain circuit 20 is embossed and its lugs bent up, the overmolded routing circuit 30, 40, 50 is assembled with the embossed drain circuit 20 and the assembly is crimped by the crimping studs, carried out hot or ultrasonically.

As an alternative, instead of overmolding the crimping studs, just after the routing plate 40 has been overmolded, and deforming them for the crimping after the plates have been assembled, the routing circuit 40 is overmolded, the drain circuit 20 is formed, these two circuits are assembled and, in a final step, crimping rivets 80 are formed directly by overmolding, as illustrated in FIGS. 8 and 9. To do this, during the overmolding of the layers 30 and 50 onto the routing plate 40, cutaways 81, 82, 83 are reserved beforehand, these allowing, during the second overmolding, the rivet 80 to be formed directly, at least in part; in the example shown, the cutaways 81, 82 allow the formation of the body of the rivet 80, and the cutaway 83 allows formation of the foot of the rivet 80. The rivet 80 may form an integral part of the package overmolded at the same time.

In the embodiments shown and described up till now, an entirely flat power module has been illustrated. This could very well consist of several flat sections making an angle between, the drain circuit, the routing circuit and the spacer remaining parallel inside each section. The module may also be connected to itself in order to increase compactness.

The invention claimed is:

1. A power switching device comprising
semiconductor members having a base and having two sets of connections,
an electrically conductive cooling plate to which the first set of connections is connected for fixing the semiconductor members by their base to the plate;
a control circuit and power connectors to which the second set of connections of the semiconductor members is connected
the plate has protuberances onto which the semiconductor members are fixed or pressed via their base and the second set of connections is connected to the control circuit and to the power connectors through a routing circuit placed generally parallel to and in the vicinity of said plate but isolated from the plate and the circuit has openings corresponding to the flat protuberances of the subjacent plate, the protuberances of the plate lie in a plane close to the routing circuit, and the semiconductor devices may be fixed to the plate and to the routing circuit substantially in the same plane.

2. The device as claimed in claim 1, further comprising the semiconductor members have a sole at their base, the sole is soldered to the protuberances of the cooling plate.

3. The device as claimed in claim 1, further comprising a nonconductive spacer positioned to isolate the routing circuit from the cooling plate.

4. The device as claimed in claim 3, wherein the spacer provides mechanical retention between the cooling plate and the routing circuit.

5. The device as claimed in claim 3, wherein the spacer is overmolded onto the routing circuit.

6. The device as claimed in claim 1, wherein the routing circuit includes a surface having a covering layer thereon.

7. The device as claimed in claim 6, wherein the covering layer is overmolded onto the routing circuit.

8. The device as claimed in claim 1, further comprising a plastic package including a wall having protuberances thereon corresponding to the protuberances of the plate and the cooling plate is affixed to the wall.

9. The device as claimed in claim 8, wherein the wall of the package includes external ribs.

10. The device as claimed in claim 1, wherein the cooling plate includes bent-up flanges.

11. The device as claimed in claim 1, wherein the package includes two superposed sets comprised of a cooling plate, a spacer and a routing circuit.

* * * * *